United States Patent
Hasegawa et al.

(10) Patent No.: US 7,129,549 B2
(45) Date of Patent: Oct. 31, 2006

(54) SEMICONDUCTOR INTEGRATED CIRCUIT DEVICE

(75) Inventors: Masatoshi Hasegawa, Hamura (JP); Kazutaka Mori, Kokubunji (JP); Tomofami Hokari, Hamura (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/866,991

(22) Filed: Jun. 15, 2004

(65) Prior Publication Data

US 2005/0035411 A1 Feb. 17, 2005

(30) Foreign Application Priority Data

Aug. 11, 2003 (JP) .............................. 2003-290995

(51) Int. Cl.
*H01L 27/92* (2006.01)
(52) U.S. Cl. ................ 257/392; 275/369; 275/E27.064
(58) Field of Classification Search ................ 257/391, 257/903, 369, E27.108, 269, 392, E27.064, 257/E21.632
See application file for complete search history.

(56) References Cited

U.S. PATENT DOCUMENTS

| 5,633,523 A | * | 5/1997 | Kato | ........................... 257/369 |
| 6,198,140 B1 | * | 3/2001 | Muramoto et al. | ......... 257/392 |
| 6,380,764 B1 | | 4/2002 | Katoh et al. | .................. 326/93 |
| 6,433,398 B1 | * | 8/2002 | Suzuki et al. | ............... 257/392 |
| 6,900,492 B1 | * | 5/2005 | Takaura et al. | ............. 257/296 |

FOREIGN PATENT DOCUMENTS

JP 11-195976 7/1999

* cited by examiner

*Primary Examiner*—Kenneth Parker
*Assistant Examiner*—Matthew C. Landau
(74) *Attorney, Agent, or Firm*—Miles & Stockbridge, P.C.

(57) ABSTRACT

A semiconductor integrated circuit device realizing high integration and a simplified manufacturing process. The circuit includes a gate insulator with a first film thickness, a first N-channel MOSFET and a first P-channel MOSFET, in which a polysilicon layer consists of a gate electrode including an N-type impurity dose, and a gate insulator with a second film thickness thinner than the first film thickness. The circuit also includes a second N-channel MOSFET and a second P-channel MOSFET in which the polysilicon layers are doped with N-type impurity and P-type impurity, respectively. Gate electrodes of said first N-channel MOSFET and first P-channel MOSFET are formed as one body and connected to each other.

8 Claims, 9 Drawing Sheets

FIG.1A

ELEMENTS HAVING THICK LAYER

FIG.1B

ELEMENTS HAVING THIN LAYER

SEMICONDUCTOR INTEGRATED CIRCUIT DEVICE

CLAIM OF PRIORITY

The present application claims priority from Japanese application JP 2003-290995 filed on Aug. 11, 2003, the content of which is hereby incorporated into this application.

FIELD OF THE INVENTION

This invention relates to a semiconductor integrated circuit device and, more particularly, relates to an effective element routing method for CMOS circuits comprising two kinds of gate oxide film thickness processes.

BACKGROUND OF THE INVENTION

As an example of a semiconductor integrated circuit comprising a MOSFET with two kinds of gate oxide film thicknesses, U.S. Pat. No. 6,380,764 (JP-A 195976/1999) was reported. According to said patent document, in a semiconductor integrated circuit having a plurality of signal paths, in the case of a path having a margin for delay of signal propagation along the signal path, the device consists of a MOSFET with a high threshold voltage. On the other hand, in the case of a path having no margin for delay, the device consists of a MOSFET with a low threshold voltage which has a large sub-threshold leakage voltage, but faster operation speed.

A means of realizing the above-described high threshold voltage and low threshold voltage MOSFETs is selected from the following: changing the impurity content of the semiconductor substrate underneath the gate oxide film, changing the thickness of the gate oxide film, changing the substrate bias voltage applied to the well region, changing the gate length, and a combination of these techniques.

The present inventors investigated an element routing method suitable for high integration with a simplified manufacturing process for CMOS circuits when the CMOS circuits consist of a MOSFET with the above-described two kinds of gate oxide film thickness. In contrast to the present invention, the prior art technique described in said patent document focuses on increasing speed and lowering power consumption of the semiconductor integrated circuit device and does not concern itself with high integration and simplifying the manufacturing process of CMOS circuits using MOSFETs with two kinds of gate oxide film thickness.

SUMMARY OF THE INVENTION

It is a general object of the present invention to provide a semiconductor integrated circuit device accomplishing high integration and a simplified manufacturing method. This, and other objectives and new features of this invention, will be more clearly understood from the following descriptions and the accompanying drawings.

The following is a brief description of a typical embodiment disclosed in the present invention.

That is, it comprises:

a first N-channel MOSFET and first P-channel MOSFET having a gate insulator with a first film thickness, wherein a polysilicon layer constituting a gate electrode is doped with a first conductive type impurity dose, a second N-channel MOSFET having a gate insulator with a second film thickness less than said first film thickness, wherein a polysilicon layer constituting a gate electrode is doped with an N-type impurity dose, and a second P-channel MOSFET, wherein a polysilicon layer constituting a gate electrode is doped with a P-type impurity dose, a circuit comprising gate electrodes of said first N-channel MOSFET and first P-channel MOSFET formed as one body and connected to each other.

This invention provides ways for making a layout such that a CMOS circuit mutually connecting gates of a thick film P-channel MOSFET and N-channel MOSFET can be directly connected to a gate, thereby achieving down-sizing and routing process reduction.

DETAILED DESCRIPTION OF THE PREFERRED EMBODIMENTS

Figure 1A:
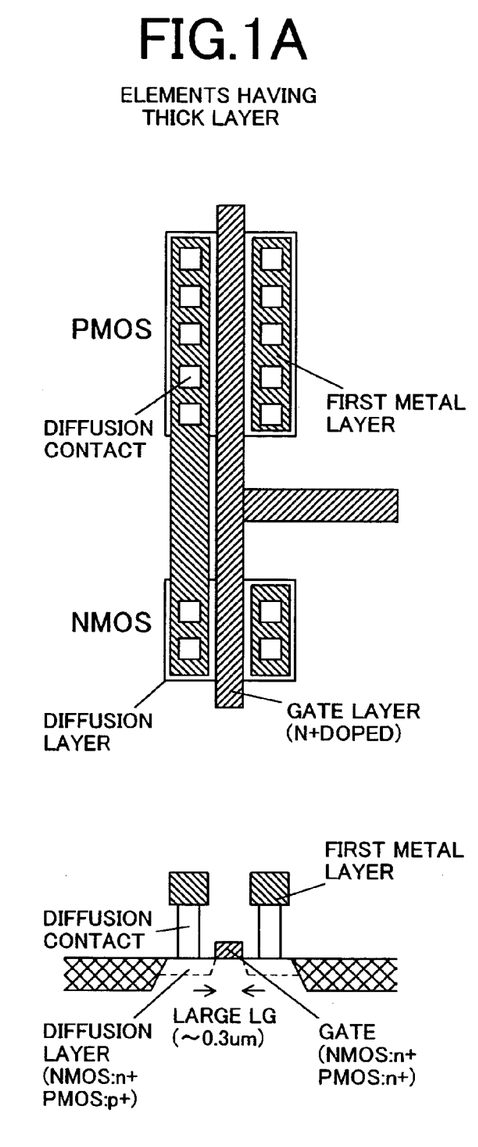
FIG. 1 is a block diagram schematically illustrating an embodiment of a MOSFET formed in a semiconductor integrated circuit device according to the present invention.
Figure 1B:
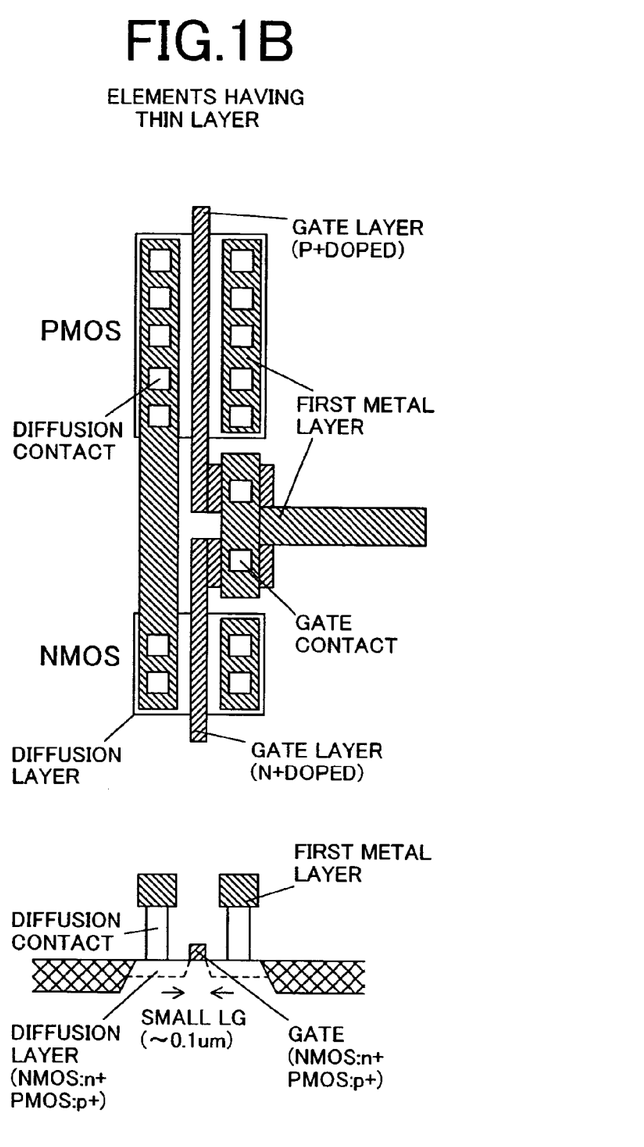

FIG. 1 shows a block diagram of an example of a MOSFET formed in a semiconductor integrated circuit according to the present invention. CMOS circuits comprising two kinds of gate insulators (gate oxide layer) such as a MOSFET having a thick layer, as shown in FIG. 1A, and a MOSFET having a thin layer, as shown in FIG. 1B, are mounted to a semiconductor integrated circuit device as shown in this embodiment.

The layout of a MOSFET having a thick layer as shown in FIG. 1A is called a single function gate, wherein the dose of the gate is the same in the P-channel MOSFET (hereinafter abbreviated as PMOS) and the N-channel MOSFET (hereinafter abbreviated as NMOS). That is, a P-channel MOSFET has an n+ dose gate in an embedded channel. Thus, because gate electrodes of both P-channel MOSFET and N-channel MOSFET are the same n+ dose, the gate electrodes can be used as a metal layer connecting the PMOS/NMOS, achieving a down-sized layout.

On the other hand, in this configuration, it is impossible to make the gate length Lg smaller (narrow line width), because the n+ gate PMOS does not have good channel characteristics, but forming a long gate length Lg (wide line width) is necessary because of a limitation of the source-drain dielectric breakdown voltage caused by the high voltage a thick layer MOS brings, therefore it does not become a problem. For instance, as shown in the example of a schematic device configuration in FIG. 1A, source and drain diffusion layer of the thick layer structured NMOS comprises an n+ diffusion layer formed on the semiconductor substrate sandwiching the gate, and the source and drain diffusion layer of a PMOS comprises a p+ diffusion layer formed on the semiconductor substrate sandwiching the gate. Accordingly, the gate length Lg, a distance between said source and drain diffusion layer, is formed as thick (long) as ~0.3 μm, and the gates of both NMOS/PMOS are given the same n+ dose.

The MOSFET having a thin layer shown in FIG. 1B comprises a dual function gate, wherein the dose of the gate is different in PMOS and NMOS. In other words, a P-channel MOSFET comprises a p+ dose gate at the surface channel and a P-channel MOSFET comprises an n+ dose gate at the surface channel. Thus, the gate electrode is separated by PMOS/NMOS, and the gate electrodes of PMOS/NMOS are connected in the first metal layer formed on the gate contact part.

For instance, as shown in an example of a schematic device configuration in FIG. 1B, the source and drain diffusion layer of the thin layer structured NMOS comprises an n+ diffusion layer formed on the semiconductor substrate sandwiching the gate, and the source and drain diffusion layer of the PMOS comprises a p+ diffusion layer formed on the semiconductor substrate sandwiching the gate. Then, the gate length Lg, the distance between said source and drain diffusion layers, is formed as thin (short) as ~0.3 μm. Although a first metal layer connected to the gate electrode is omitted in the device configuration drawing, the first metal layer is the same as the first metal layer connected to the source and drain. Therefore, the layout area becomes larger as shown in the exemplary layout. However, it is necessary to make the channel length Lg thinner to achieve high performance in a low voltage device, and the dual gate process is indispensable to improve the short-channel effect.

Making full use of the features of a MOSFET having the above-described two kinds of configuration, for instance in a DRAM and logic circuit embedded semiconductor integrated circuit device, a single gate thick film MOSFET is used in a word driver of the DRAM and a dual gate thin film MOSFET is used for the other peripheral circuits and logic circuits. The thick film MOS of the word driver part comprises a small area layout in which PMOS/NMOS are connected to the gate layer and, in the thin film MOS of the other peripheral circuits and logical circuits, the gate of PMOS/NMOS is not connected to the gate layer but connected to an upper metal layer such as the first metal layer, whereby a layout is created such that mutual diffusion of the gate dose does not occur.

Figure 2:
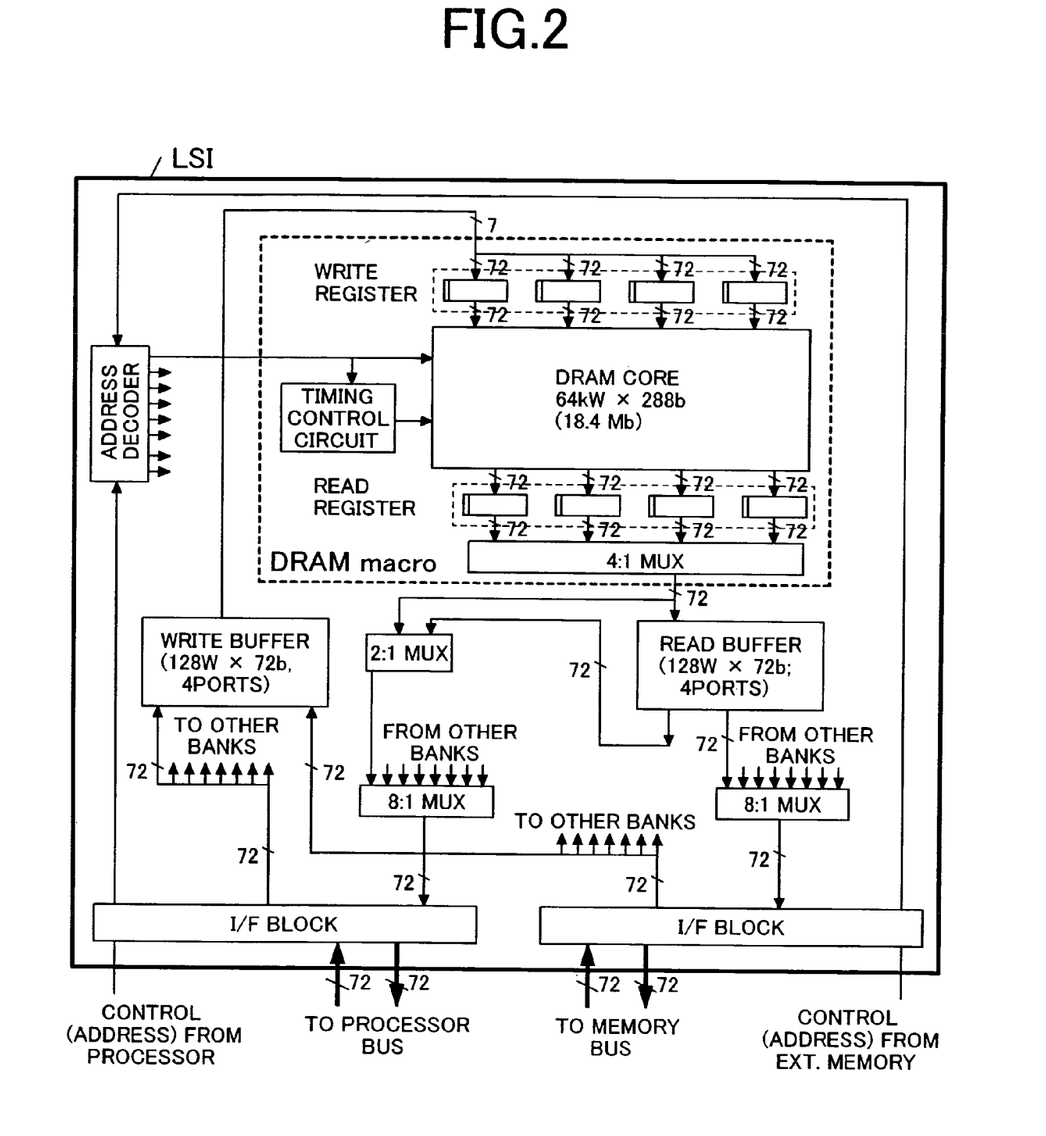
FIG. 2 is a block diagram schematically illustrating an embodiment of a semiconductor integrated circuit device according to the present invention.

FIG. 2 shows a block diagram of an example of a semiconductor integrated circuit applying this invention. The semiconductor integrated circuit device LSI shown in this embodiment is a so-called consolidation DRAM, and it is composed of DRAM macro and peripheral circuits controlling it. The DRAM macro comprises a DRAM core, a timing control circuit performing timing control, write resister, read register, and multiplexer MUX.

The semiconductor integrated circuit device LSI shown in this embodiment is used as a cache memory, but it is not specified. The outer interface of the semiconductor integrated circuit device LSI comprises an interface block (I/F Block) corresponding to the processor and an interface block (I/F Block) corresponding to the memory. Corresponding to these two interface blocks, a write buffer, read buffer, and multiplexer MUX are installed. The write buffer and read buffer consist of a static type RAM and the multiplexer MUX consists of a logic circuit formed from a gate array etc, but it is not specified. Because outside devices such as a microprocessor can access the read buffer or write buffer, high-speed read/write can be achieved. That is, the read buffer and write buffer work as a first cache and the DRAM macro becomes a second cache.

The DRAM reads from the DRAM core with a unit of 288 bits through a main amplifier (main amp), memorizes it in the register with a unit of 72 bits, selects one register by a multiplexer MUX, and outputs to the read buffer. The write data are input with a unit of 72 bits and stored in the corresponding register.

In the write amp, read data are saved with a unit of 288 bits, and data with a unit of 72 bits kept in the register are selectively converted. In the writing operation, data are written all together with a unit of 288 bits, but rewriting with a unit of 72 bits is enabled by said register.

Figure 3:
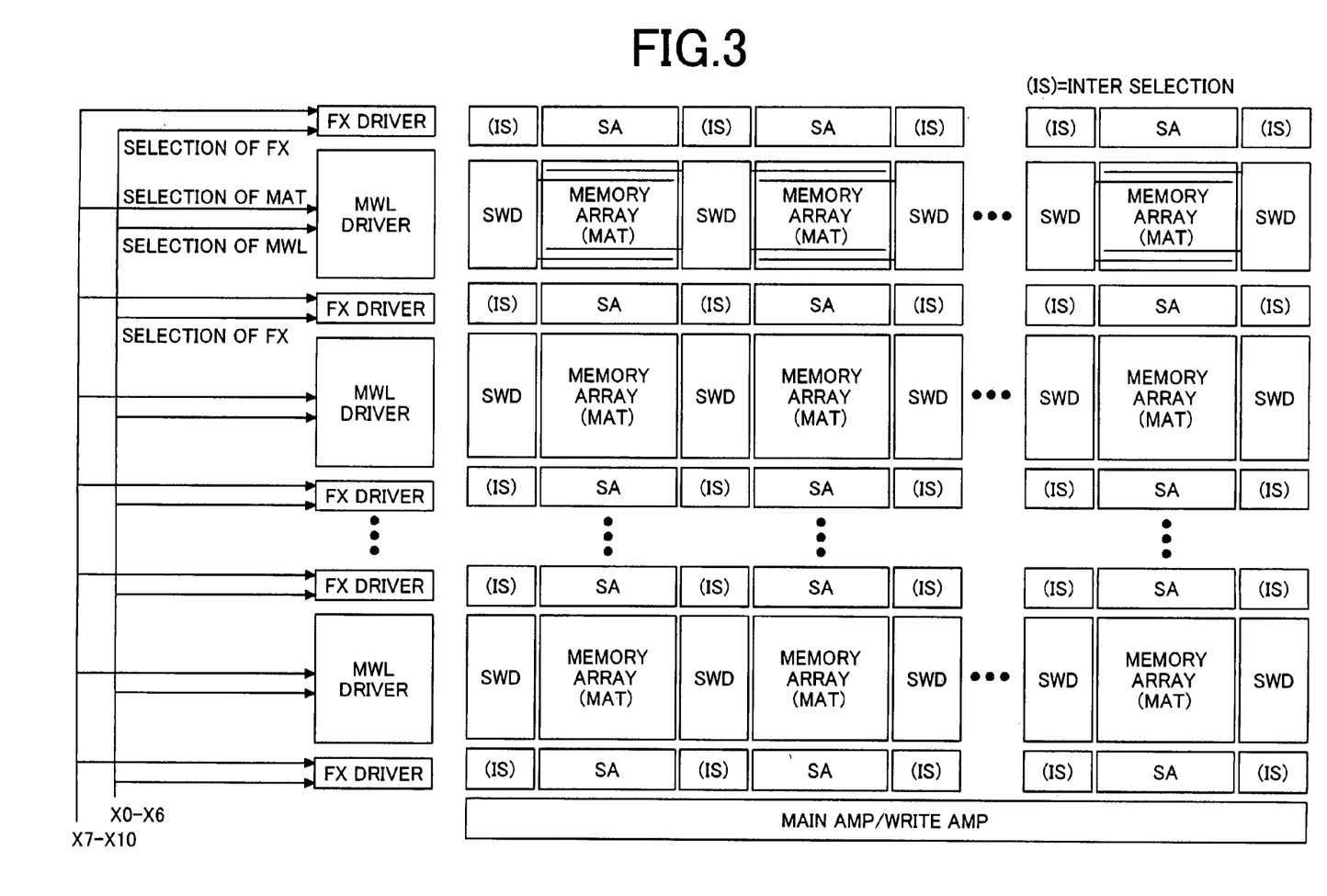
FIG. 3 is a schematic layout diagram illustrating an embodiment of a memory array of a DRAM macro described in FIG. 2.

FIG. 3 shows a schematic layout diagram of an example of a memory array of the DRAM macro illustrated in FIG. 2. The memory array consists of a plurality of memory arrays (memory mat) divided into the word line direction and the bit line direction, respectively. The divided memory arrays are divided into the bit line direction with the sense amplifier SA. It is divided into the word line direction with a sub-word driver SWD. For instance, the mat is specified by four upper rank bits (X7–X10) of the X address. In the configuration in which the mat is selected by a four-bit address X7–X10, the number of memory arrays divided into the bit line direction is 16.

The word line of the memory array is selected by the low-order 7 bits of the X address.

The low-order 7 bits (X6–X0) are used for selecting a main word line and an FX line, which are pre-decode signal lines. Wherein, the FX line is the one selecting one sub-word line which is one of a plurality of sub-word lines allocated to one main word line. For instance, in the case when eight sub-word lines are allocated to one main word line, FX lines are composed of eight pieces. The 3-bit addresses X0–X2 are used to select this FX line. In order to select the word line of hierarchy word line type memory cell arrays as described above, word line selection circuits are provided with main word (MWL) drivers, sub-word drivers (SWD) and FX drivers.

Figure 4:
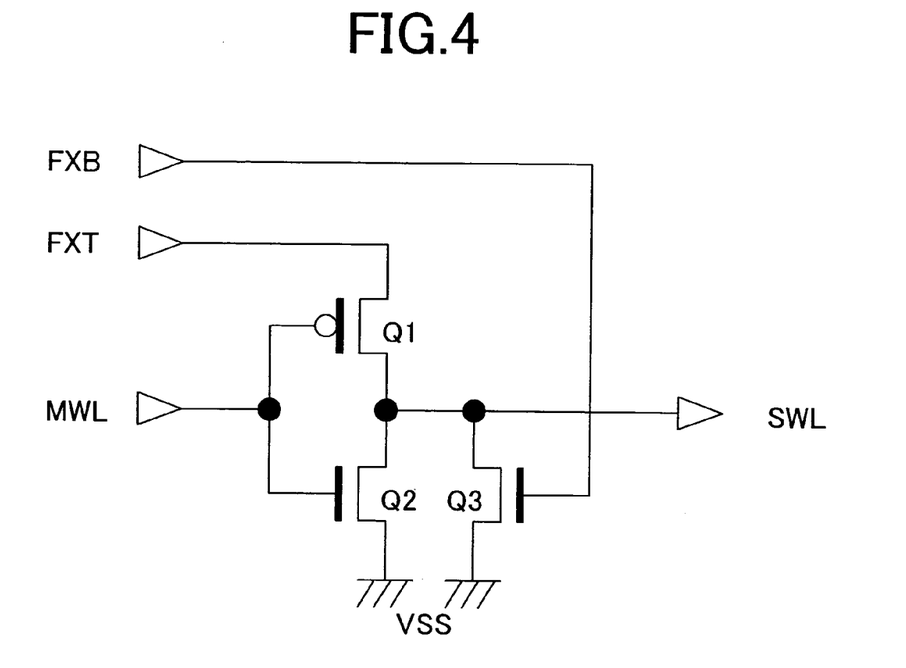
FIG. 4 is a circuit diagram schematically illustrating an embodiment of a sub-word driver shown in FIG. 3.

FIG. 4 is a circuit diagram schematically illustrating an embodiment of a sub-word driver shown in FIG. 3. In this embodiment, one sub-word driver corresponding to the main word lines MWL, FXT and FXB is illustrated, and consists of MOSFETQ1–Q3. In this figure, adding o, meaning inversion at the gate, means a P-channel MOSFET, and it is distinguished from an N-channel MOSFET by this symbol.

A P-channel MOSFETQ1 and an N-channel MOSFETQ2 compose a CMOS inverter circuit, and the gates of MOSFETQ1 and Q2 are connected to the main word line MWL. The word line selection signal FXT is supplied in common to the drain of sub-word driver's P-channel MOSFETQ1, that is, to the operation voltage taps of a CMOS inverter circuit. The N-channel MOSFETQ3 is provided to the output taps of the sub-word driver and the word selection signal FXBO is supplied to the gate. Although it is not illustrated, sharing one main word line MWL, four sub-word drivers as shown in this figure are provided to one end of a memory array word line corresponding to the word line selection signals FX0, FX1, FX4, and FX5, respectively, and to the other end of a memory array word line, the remaining four sub-word drivers are provided, corresponding to the word line selection signals FX2 and 3, and FX6 and 7. The output taps of sub-word driver composed of MOSFETQ1–Q3 are connected to the sub-word line SWL consisting of an FG layer.

The following are the selection operations of the sub-word line SWL. When the main word line MWL is in a low level selection state and the word line selection signal FXT is in a high level selection state, P-channel MOSFETQ1 becomes on and transfers the high level of the word line selection signal FXT to the sub-word line SWL. When the main word line MWL is at a non-selection high level, N-channel MOSFETQ2 becomes on and makes the sub-word line SWL a low level non-selection level. When the main word line MWL is in a low level selection state and the word line selection signal FXT is in a low level non-selection state, P-channel MOSFETQ1 becomes on, but a threshold voltage of P-channel MOSFETQ1 remains on the sub-word line SWL, so that it is impossible to make it a low level like an earth potential. Thus, MOSFETQ3 is on because of a high level of FXB, and it makes the sub-word line SWL a low level like an earth potential.

Figure 5:
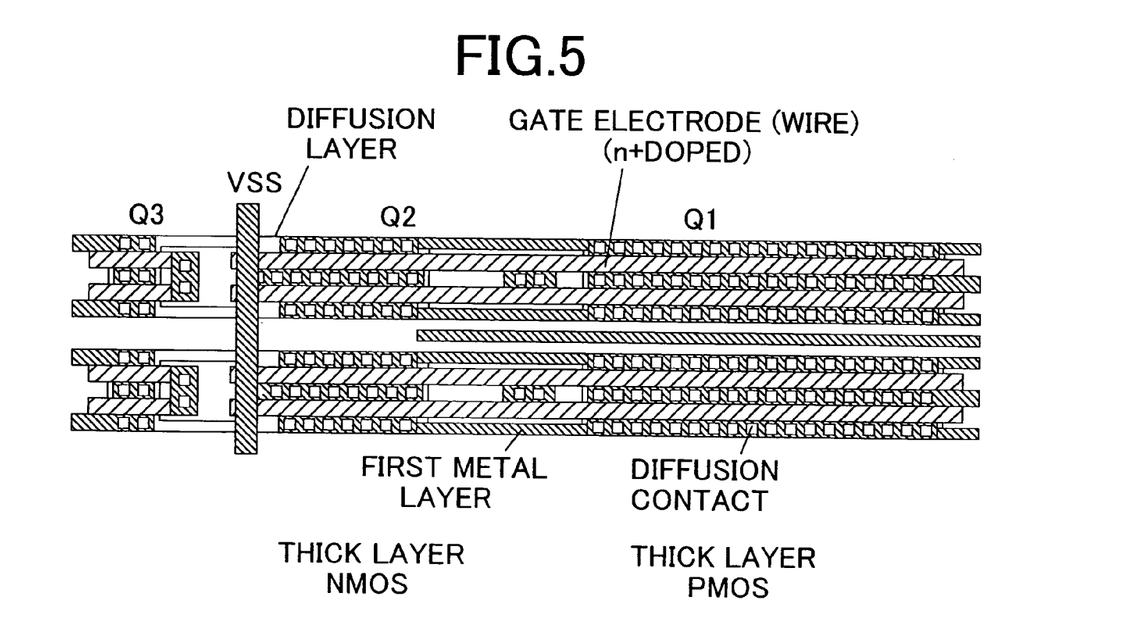
FIG. 5 is a layout diagram illustrating an embodiment of a sub-word driver related to the present invention.

FIG. 5 is a layout diagram illustrating an embodiment of a sub-word driver related to the present invention. A thick film structured MOS described in FIG. 1A is used for it because a sub-word driver MOSFET has a high word line boost level. That is, in order to make it possible to transfer a high level of the bit line to the capacitor of the memory cell, it is necessary to set the selection level of the word line higher than the threshold voltage of the memory cell's address selection MOSFET corresponding to the high level of a bit line. Additionally, because one circuit of the sub-word driver is laid out at four times the pitch of the main word line MWL, the density of the first metal layer is too high to connect the gates of PMOS/NMOS (Q1, Q2) in the first metal layer. Thus, they are directly connected in the gate layer as shown in this figure. That is, in the thick layer structured MOSFET described in FIG. 1A, polysilicon (polysi) of the gate consisting of embedded channels is doped with an n+ dose, thereby the gate polysilicon (polysi) in the PMOS/NMOS (Q1, Q2) are both doped with the same n+ dose. It becomes possible to achieve a layout where there is direct connection to each other, because problems caused by the mutual diffusion by a direct connection do not arise.

Figure 6:
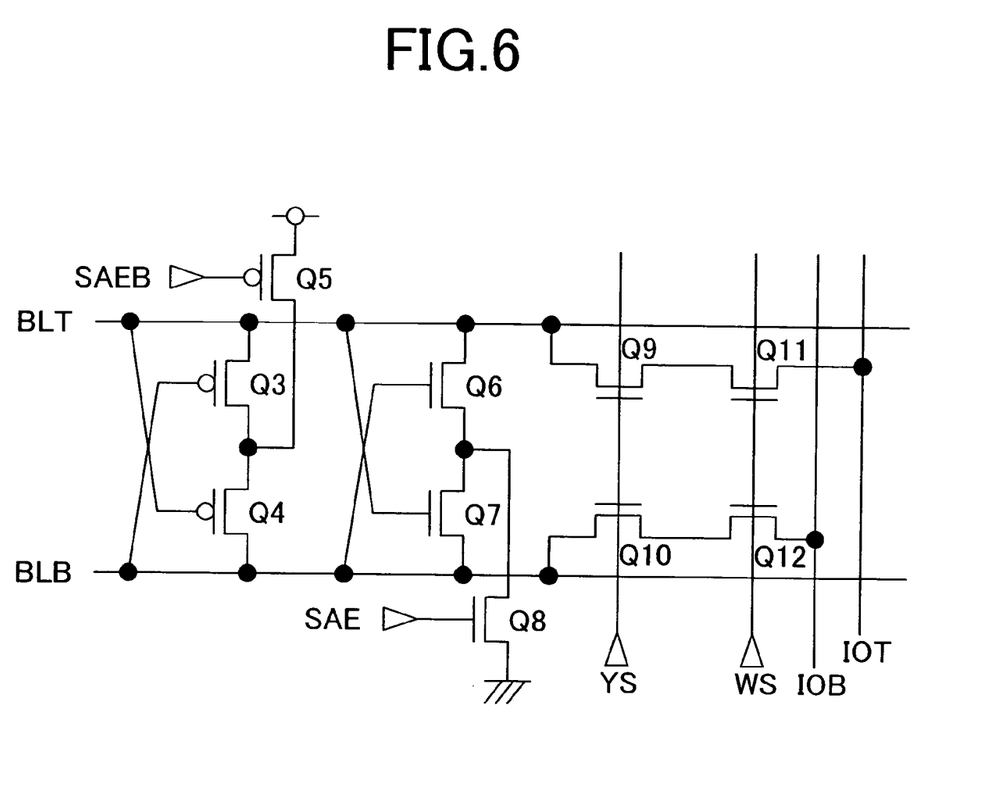
FIG. 6 is a main circuit diagram illustrating an embodiment of a sense amplifier part according to the present invention.

FIG. 6 is a main circuit diagram illustrating an embodiment of a sense amplifier part according to the present invention. In this figure, a sense amplifier and writing circuit etc. corresponding to a pair of complementary bit lines BLT and BLB are illustrated by example as representative. Adding o, meaning inversion at the gate, also means P-channel MOSFET in this figure. As shown in this figure, the bit lines BLT and BLB are arranged in parallel, and although it is not specifically limited thereto, they are made to intersect each other if it is necessary to balance the capacity of the bit lines. The I/O node of the sense amplifier is connected to these complementary bit lines BLT and BLB.

A unit circuit constituting the sense amplifier is composed of the CMOS latch circuit comprising N-channel type MOSFETQ6 and Q7 and P-channel type MOSFETQ3 and Q4, wherein the gate and drain are formed in a latch configuration by inter-connecting the gate and the drain. N-channel type power switch MOSFET Q8 is provided to the source of the N-channel type MOSFET Q6 and Q7. Timing signal SAE is supplied to the gate of MOSFETQ8, which turns on by synchronizing at a high level, and then earth potential GND is supplied to the source of the N-channel MOSFETQ6 and Q7. P-channel type power switch MOSFET Q5 is provided to the source of P-channel type MOSFET Q3 and Q4. Timing signal SAEB is supplied to the gate of MOSFETQ5, which turns on by synchronizing at a low level, and then the supply voltage VDD is supplied to the source of the N-channel MOSFETQ3 and Q4. The source of N-channel MOSFETQ6 and Q7 and the source of P-channel MOSFETQ3 and Q4 may also be connected in common to a source of above-described similar N-channel type MOSFET and P-channel type MOSFET of other similar CMOS latch circuits.

Although it is not illustrated, a switch MOSFET supplying a half pre-charge voltage and a pre-charge circuit comprising a MOSFET short-circuiting these are provided to the I/O nodes BLT and BLB of the sense amplifier. A pre-charge signal is supplied in common to the gates of these MOSFETs. Additionally, a pre-charge circuit comprising a switch MOSFET short-circuiting these common source lines and a switch MOSFET supplying the half pre-charge voltage is provided to the common source lines of the sense amplifier.

A direct sense circuit consisting of the reading system circuit and a write circuit consisting of the writing system circuit are provided to the I/O nodes BLT and BLB of the sense amplifier. The write circuit consists of N-channel MOSFETQ9–Q12. The write circuit comprises MOSFETQ9, Q1 and Q11 and MOSFETQ10 and Q12 connected in series with the I/O nodes BLT and BLB of the sense amplifier and the complementary signal lines 10T and 10B for writing. The gates of MOSFETQ9 and Q10 are connected as column switches to the column selection line YS. The gates of MOSFETQ11 and Q12 are connected with the timing signal line WS which directs the writing operation.

Besides connecting the I/O nodes BLT and BLB of the sense amplifier to the complementary bit lines as described in this embodiment, using a so-called shared sense amplifier, wherein two right-left pairs of complementary bit lines are provided, may also be acceptable. That is, connecting left-sided and right-sided bit lines with the complementary bit lines, respectively, through the shared switch MOSFET corresponding to the I/O nodes BLT and BLB may be acceptable. A selection signal to select either one is applied to the gate of the shared switch MOSFET, and the selection level of the selection signal is made a high level like step-up voltage VPP, the same as the selection level of the word line etc. Therefore, the shared switch MOSFET is set to have a high threshold voltage, the same as that of the address selection MOSFET of a dynamic type memory cell.

Figure 7:
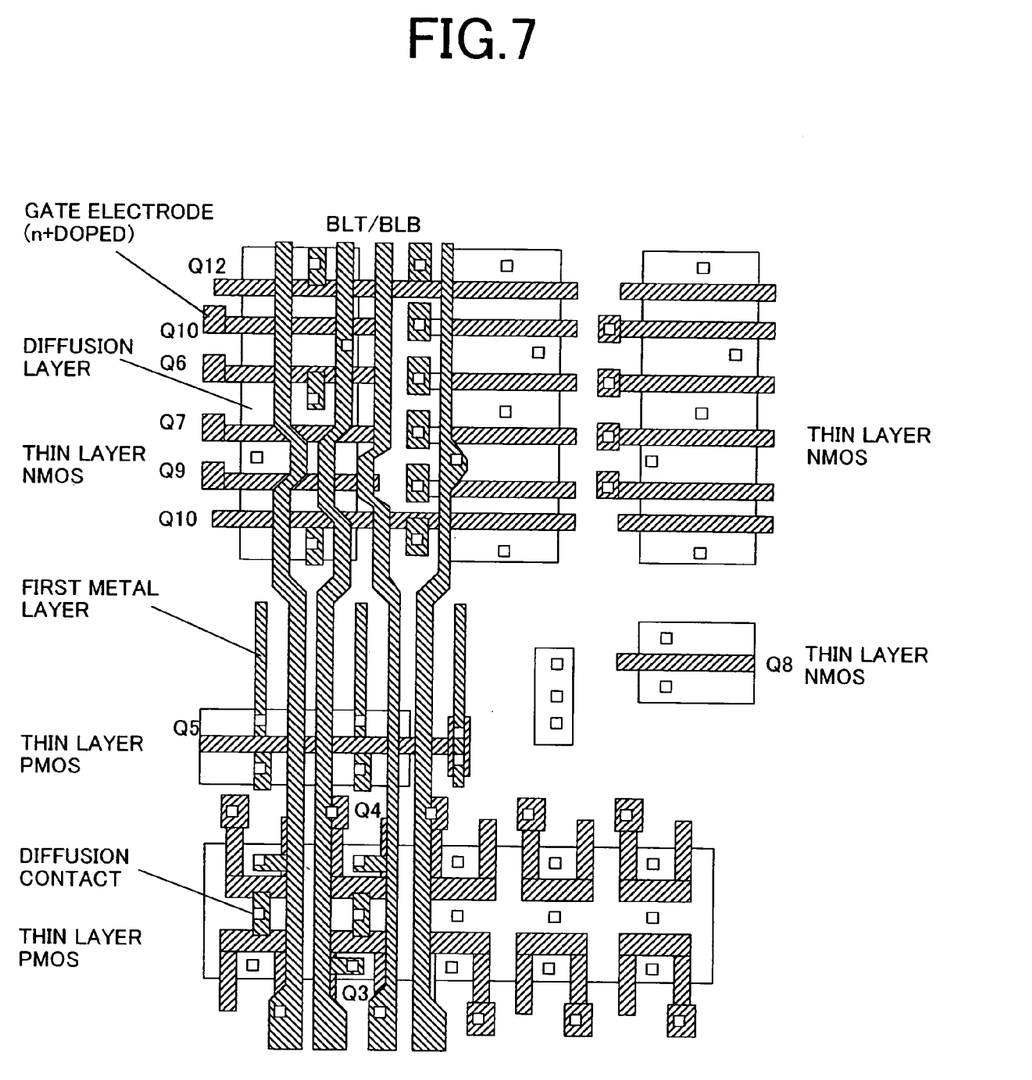
FIG. 7 is a layout diagram illustrating an embodiment of a sense amplifier part according to the present invention.

FIG. 7 is a layout diagram illustrating an embodiment of a sense amplifier section according to the present invention. The power supply of the sense amplifier uses the same supply voltage VDD as logic, and the thin-layer structured MOS shown in FIG. 1B is used because the voltage is lower than the selection level of the word line described above. The gate length Lg of the thin-film structured MOS is designed fine to determine the speed performance of the chip. Surface-channeling is necessary to make a fine gate length Lg, and the polysilicon (polysi) of the gate is doped with a p+ dose. That is, the layout of the gate layer is separated because of differences of the dose in the gates of NMOS/PMOS, and they are connected in the first metal layer. The first metal layer is used for layout of bit lines and, because the bit lines are input in the gate of the sense amplifier MOS, this layout becomes possible being different from a word driver.

In FIG. 7, two pairs of the complementary bit lines BLT/BLB are illustrated by example. Herein, P-channel MOSFETQ3 and Q4, power switch MOSFET Q4, N-channel MOSFETQ6 and Q7, power switch MOSFET Q8, and MOSFETQ9–Q12 consisting of the write amplifier, which are connected to a pair of complementary bit lines BLT/BLB, are illustrated by example. The power switches MOSFETQ5 and Q8 are respectively used in common with a plurality of sense amplifier units. The gates of N-channel MOSFET Q6, Q7 and the complementary bit lines BLT/BLB are connected in latch configuration in a second metal layer which is not illustrated in the figure. On the other hand, latch configuration P-channel MOSFETQ3 and Q4 are interconnected with the complementary bit line BLT/BLB consisting of the first metal layer.

Figure 8A:
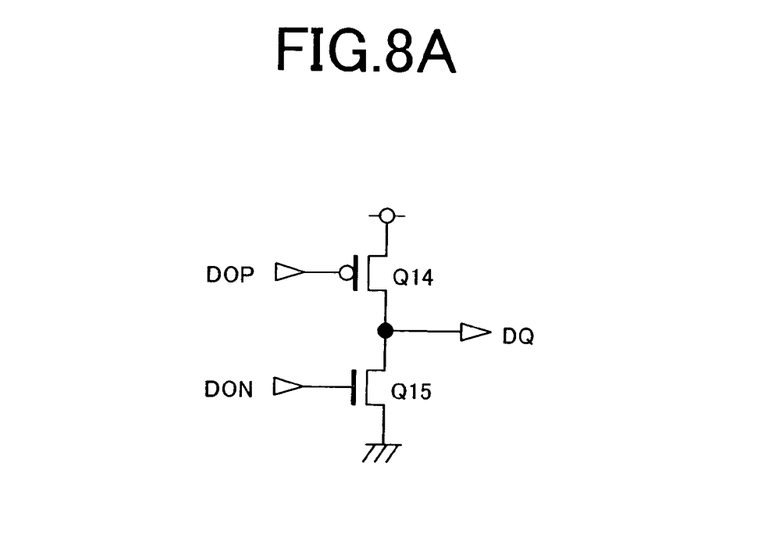
FIG. 8 is an explanation diagram illustrating an embodiment of an output circuit according to the present invention.
Figure 8B:
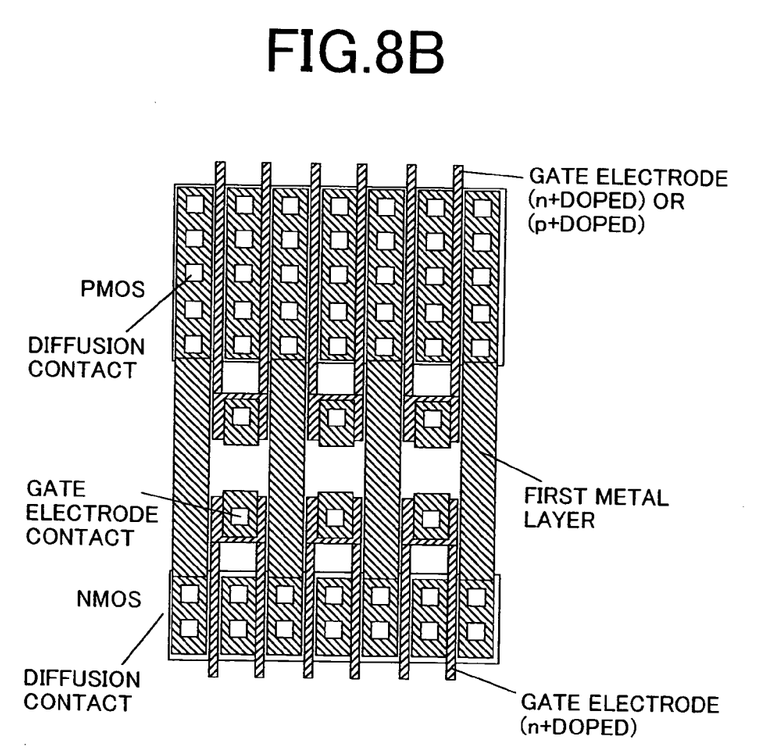

FIG. 8 is an explanation diagram illustrating an embodiment of an output circuit according to the present invention. FIG. 8A illustrates an embodiment of an output circuit, and 8B illustrates an embodiment of the corresponding layout. The output circuit changes the working voltage depending on the voltage of the board on which the chip is used. In the case of a low voltage (for example 1.5/1.8V), the same as a logic portion of a semiconductor integrated circuit device LSI, a thin-layer MOS is used, and in the case of a high voltage (for example 2.5/3.3V), a thick-layer MOS is used.

In this embodiment, PMOS means a p+ dosed gate in the surface channel in the case consisting of a thin-layer MOS, and PMOS means an n+ dosed gate in the embedded channel in the case consisting of a thick-layer MOS. As described above, in the case consisting of a thick-layer MOS, it is possible to connect the gate of PMOS-NMOS directly in the gate layer, but, in the case of an output circuit, the gate is separated and connected in the metal layer even if it is an n+ dosed gate, because there is a possibility that the impedance of PMOS and NMOS may be controlled independently by the layout. Moreover, a thick-layer MOS is used in the step-up supply circuit in the DRAM chip. However, because there is room in the layout area, the gate is connected separately at the metal layer to increase the degree of freedom of the layout.

Figure 9:
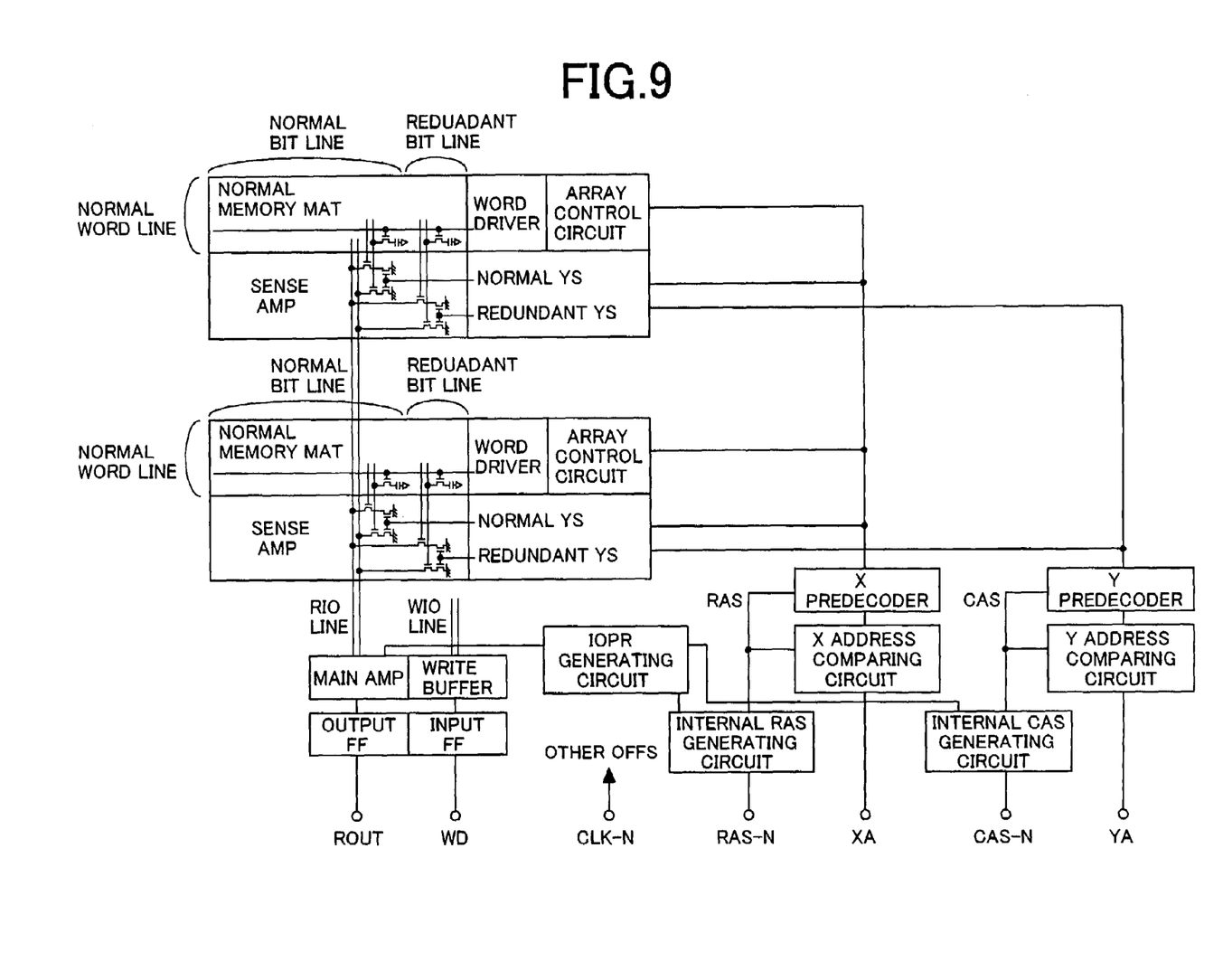
FIG. 9 is a schematic block diagram illustrating an embodiment of a DRAM macro according to the present invention.

FIG. 9 is a schematic block diagram illustrating an embodiment of a DRAM macro according to the present invention. A relief circuit of a word line and bit line is provided to the DRAM macro shown in this embodiment. The memory array has redundant word lines and redundant bit lines in addition to normal bit lines and normal word lines. The redundant bit lines are placed in each memory array, and the redundant word lines are put together and placed in a plurality of memory arrays, although it is not limited thereto. In this case, the redundant word lines are allocated to be shared with a plurality of memory arrays having common I/O lines (RIO and WIO) connected to the main amplifier and write buffer. The X address comparing circuit and Y address comparing circuit memorize bad addresses corresponding to each bad word line and bad bit line, and, when address signals XA and YA are input according to these bad word lines and bad bit lines, it inhibits the selection operation of the bad word line and bad bit line against the X pre-decoder and Y pre-decoder, and both X relief and Y relief are performed by exchanging into the redundant word lines and the redundant bit lines.

A DRAM control logic generating circuit in a semiconductor integrated circuit device as shown in FIG. 2 forms RAS-N and CAS-N consisting of the command to access the macro and address signal XA and YA. The clock CLK-N is a clock signal for normal operation and is transmitted to each FF. The internal signal ras created in the internal RAS generation circuit from RAS-N, latches the address of the activating lead line and controls activating the word line, starting the sense amplifier, shutting-down the word line and timing of the pre-charge operation of the bit line. The internal signal cas created in the internal CAS generation circuit from CAS-N, latches the address of the activating YS line and controls activating the YS, starting the main amplifier, and timing of the pre-charge operation of the IO line. Data amplified by the main amplifier are latched at the output FF and output from the output terminal ROUT. The writing data input from the write data terminal WD is latched to the input FF and written in the memory cell selected through the write buffer. IOPR performs the pre-charge operation of the RIO line.

Figure 10:
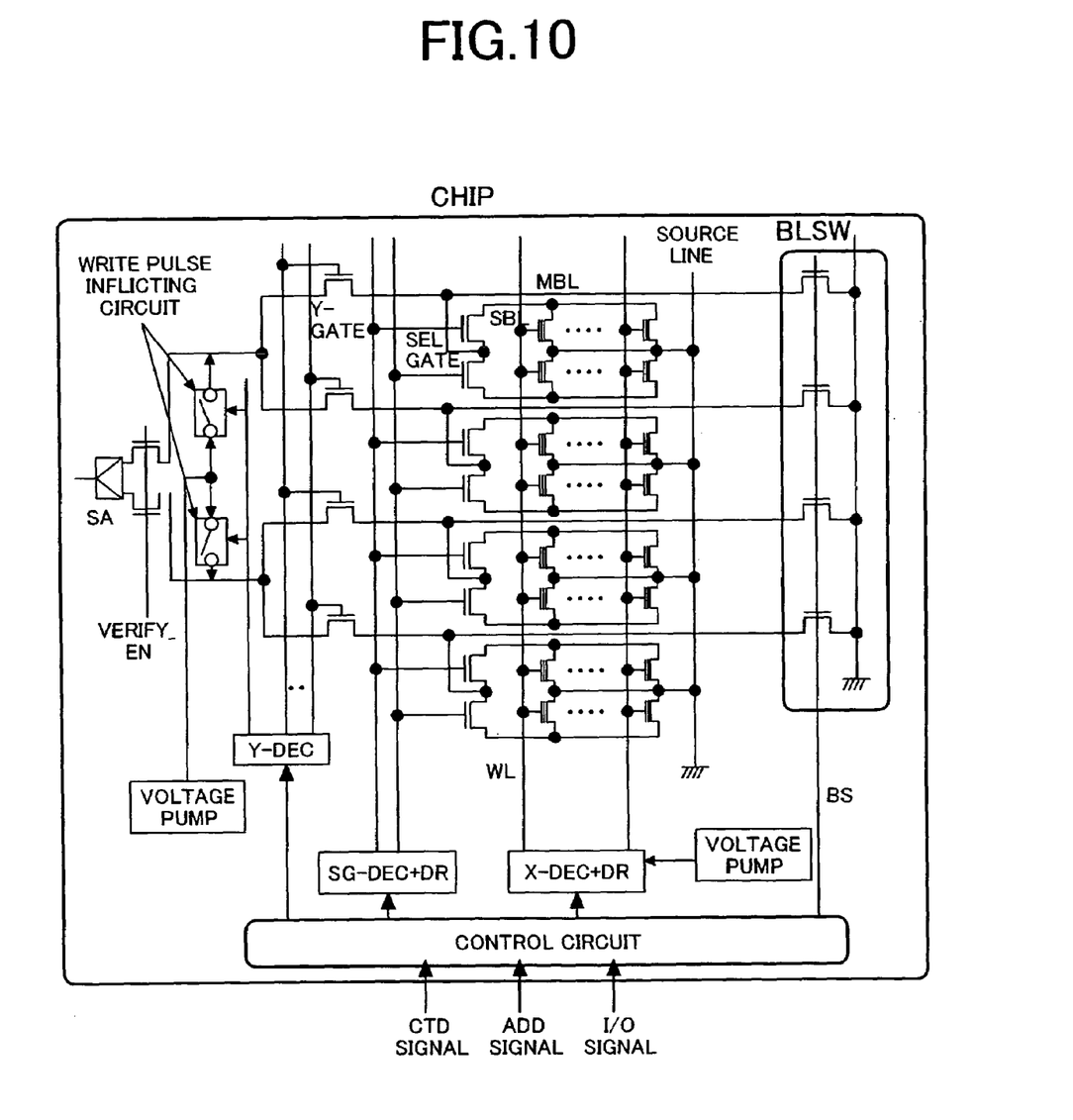
FIG. 10 is a schematic circuit diagram illustrating an embodiment of nonvolatile storage according to the present invention.

FIG. 10 is a schematic circuit diagram illustrating an embodiment of nonvolatile storage according to the present invention. The nonvolatile storage illustrated in this embodiment is a batch deletion type nonvolatile storage and is for so-called NOR type flash memory. The memory array portion is provided as the representative corresponding to the four main bit lines MBL, two sub-bit lines SBL placed along the extended direction of the bit line against each main bit lines MBL, two word lines, and sub-bit line SBL lying along the word line, and the common source line placed along the extended direction of the word line are illustrated by example.

The nonvolatile memory cell comprises a stacked structure consisting of a source, a drain, a floating-gate formed on a semiconductor substrate placed between the source and drain through the gate insulator, and a control gate placed on the floating-gate through the insulator. The memory cell is arranged at the intersection of the word line and the sub-bit line SBL, the control gate is connected to the word line, the drain is connected to the sub-bit line SBL, and the source is connected to the source line.

The selection switch MOSFET is placed between the main bit line MBL and the sub-bit line SBL. Of these switch MOSFETs, one switch MOSFET (SEL-Gate) becomes on according to a selection signal created by the sub-gate decoder-driver SG-Dec+Dr, and one sub-bit line SBL is connected to each main bit line MBL. One word line is selected from the plurality of word lines WL according to a selection signal created by the X decoder-driver X-Dec+Dr.

The main bit line MBL is connected to the output node of the write pulse inflicting (generating) circuit through the Y-Gate consisting of switch MOSFET. The Y-Gate is selected by the Y decoder Y-Dec. The write pulse inflicting (generating) circuit consists of the writing circuit. The main bit line MBL is divided into two, and correspondingly the writing circuit is provided to each of them. The signal lines connected to the output nodes of the two writing circuits are paired and connected to the input terminal of the differentiation sense amplifier SA through the selection switch MOSFET. The switch MOSFET is controlled by the verify ENABLE signal (Verify_EN).

For instance, a pair of main bit lines MBL is selected by the Y-Gate in a usual reading operation or a writing verify operation, the memory current flowing through selected sub-bit line SBL being made to flow to one main bit line MBL, and the pre-charge voltage of another main bit line MBL is used as a reference voltage. The sense amplifier AS senses the potential change of the main bit line MBL corresponding to the presence of the memory current flowing through the selected sub-bit line SBL by using the reference voltage.

A MOSFET applying a high voltage uses a thick-layer structured MOSFET, and a circuit operated at low voltage consists of a thin-film structured MOSFET in such a flash memory. In the sub-gate decoder-driver SG-Dec+Dr and X decoder-driver X-Dec+Dr, the one operated by the high voltage has a thick layer structure MOS, and the driver etc. arranged in a high density between the memory arrays comprise a single function gate, wherein the same dose is doped in the gates of PMOS and NMOS as described in FIG. 1A. Thus, the gate electrode can be used as metal layer connecting PMOS/NMOS by using the fact that the gate electrodes of P-channel MOSFET and N-channel MOSFET have the same n+ dose, thereby a small area layout can be achieved.

Above we have illustrated the invention of the present inventors on the basis of the preferred embodiment. However, it is to be understood that the invention is not intended to be limited to the specific embodiment and variations may be made by one skilled in the art without departing from the scope of the invention. For instance, besides one comprising memory circuits such as the DRAM and a flash memory, the semiconductor integrated circuit device can be widely used in a circuit, which is operated at high voltage and needs high density and high integration, and various semiconductor integrated circuit devices comprising circuits operated at low voltage with high speed.

What is claimed is:

1. A semiconductor integrated circuit device comprising:
   a first N-channel MOSFET and first P-channel MOSFET each having a gate insulator film with a first film thickness, and
   a second N-channel MOSFET and second P-channel MOSFET each having a gate insulator with a second film thickness less than said first film thickness, a polysilicon layer constituting a gate electrode of said second N-channel MOSFET being doped with an N-type impurity and a polysilicon layer constituting a gate electrode of said second P-channel MOSFET being doped with a P-type impurity,
   wherein gate electrodes of said first N-channel MOSFET and said first P-channel MOSFET are formed as one body and connected to each other,
   wherein said gate electrodes of said first N-channel MOSFET and said first P-channel MOSFET are doped with a same conductive type impurity.

2. A semiconductor integrated circuit device according to claim 1, wherein said first conductive type impurity is an N-type impurity.

3. A semiconductor integrated circuit device according to claim 2, wherein a gate length of said first N-channel MOSFET and first P-channel MOSFET is formed to be longer than a gate length of said second N-channel MOSFET and second P-channel MOSFET.

4. A semiconductor integrated circuit device according to claim 3, wherein the gate electrode of said second N-channel MOSFET and the gate electrode of said second P-channel MOSFET are connected to each other with a metal layer in an upper layer connected to those gate electrodes.

5. A semiconductor integrated circuit device according to claim 4, wherein a first circuit including said first N-channel MOSFET and first P-channel MOSFET is driven by a first operation voltage,
   a second circuit including said second N-channel MOSFET and second P-channel MOSFET is driven by a second operation voltage less than said first operation voltage.

6. A semiconductor integrated circuit device according to claim 5, wherein
   said semiconductor integrated circuit device comprises a DRAM and a logic circuit,
   said second N-channel MOSFET and said second P-channel MOSFET are used for said logic circuit and for memory peripheral circuits including a sense amplifier of said DRAM,
   said first N-channel MOSFET and said first P-channel MOSFET are used for word drivers of said DRAM.

7. A semiconductor integrated circuit device according to claim 1, further comprising:
   a third N-channel MOSFET and a third P-channel MOSFET,
   wherein gate electrodes of said third N-channel MOSFET and said third P-channel MOSFET are formed as one body and connected to each other,
   wherein a polysilicon layer constituting said gate electrodes of said third N-channel MOSFET and said third P-channel MOSFET is doped with a first conductive type impurity, and
   wherein gate electrodes of said third N-channel MOSFET and said third P-channel MOSFET are connected to each other with a metal layer in an upper layer connected to those electrodes.

8. A semiconductor integrated circuit device according to claim 1, wherein
   said gate electrodes of said first N-channel MOSFET and said first P-channel MOSFET comprise a polysilicon layer.

* * * * *